United States Patent
Nakauchi et al.

(10) Patent No.: US 6,650,398 B2
(45) Date of Patent: Nov. 18, 2003

(54) WAVEFRONT ABERRATION MEASUREMENT METHOD AND PROJECTION EXPOSURE APPARATUS

(75) Inventors: Akihiro Nakauchi, Tochigi (JP); Ryuichi Sato, Tochigi (JP)

(73) Assignee: Canon Kabushi Kaisha, Tokyo (JP)

( * ) Notice: Subject to any disclaimer, the term of this patent is extended or adjusted under 35 U.S.C. 154(b) by 0 days.

(21) Appl. No.: 10/028,462

(22) Filed: Dec. 28, 2001

(65) Prior Publication Data

US 2002/0122162 A1 Sep. 5, 2002

(30) Foreign Application Priority Data

Jan. 9, 2001 (JP) .......................... 2001-001633

(51) Int. Cl.⁷ .......................... G03B 27/68; G03B 27/32
(52) U.S. Cl. .......................... 355/52; 355/77
(58) Field of Search .......................... 355/52, 53, 67, 355/71, 77; 356/399, 400

(56) References Cited

U.S. PATENT DOCUMENTS

| | | | |
|---|---|---|---|
| 5,774,205 A | 6/1998 | Sato | 355/67 |
| 5,861,944 A | 1/1999 | Nishi | 355/68 |
| 5,973,316 A | 10/1999 | Ebbesen et al. | 250/216 |
| 6,278,514 B1 | 8/2001 | Ohsaki | 355/55 |
| 6,333,776 B1 * | 12/2001 | Taniguchi | 355/52 |
| 6,414,743 B1 | 7/2002 | Nishi et al. | 355/69 |
| 6,456,377 B1 | 9/2002 | Suzuki et al. | 356/399 |

FOREIGN PATENT DOCUMENTS

| | | |
|---|---|---|
| EP | WO 98/48451 | 10/1998 |
| JP | 11-72607 | 3/1999 |

OTHER PUBLICATIONS

*Optical Shop Testing*, ed. by Daniel Malacara. "Chapter 8. Foucault, Wire, and Phase Modulation Tests," by J. Ojeda-Castañeda, and "Chapter 9. Ronchi Test" by J. Cornejo-Rodriguez, 1978: John Wiley and Sons, New York. pp. 231–322.

Born, Max and Emill Wolf. "Chapter V," *Principles of Optics, 6th Edition.* Pergamon Press, 1993, pp. 203–207.

Flanders, D.C. and Henry I. Smith. "A new interferometic alignment technique," *Applied Physics Letters*, vol. 31, No. 7, Oct. 1997. pp. 426–428.

Roychoudhuri, C. "Chapter 6: Multiple–Beam Interferometers," *Optical Shop Testing, Second Edition*, Ed. by Daniel Malacara, John Wiley & Sons: 1992. pp. 207–245.

* cited by examiner

*Primary Examiner*—Rodney Fuller
(74) *Attorney, Agent, or Firm*—Fitzpatrick, Cella, Harper & Scinto

(57) ABSTRACT

A measurement method of measuring wavefront aberration of a projection optical system in a projection exposure apparatus for projecting a reticle pattern onto a substrate via the projection optical system. The method includes a measurement step of measuring intensity of a light beam having passed through the projection optical system and a phase shift pattern at a plane conjugate to a pupil plane of the projection optical system or a plane spaced apart from the phase shift pattern enough to separately detect respective rays emerging from plural points of the pupil plane, when the phase shift pattern set near an image plane or object plane of the projection optical system for forming an image of a pattern is scanned in one or a plurality of directions perpendicular to an optical axis of the projection optical system. The method also includes a signal processing step of calculating the wavefront aberration of the projection optical system on the basis of a measurement result of the measurement step.

7 Claims, 16 Drawing Sheets

WAVEFRONT ABERRATION MEASUREMENT METHOD AND PROJECTION EXPOSURE APPARATUS

FIELD OF THE INVENTION

The present invention relates to a wavefront aberration measurement method for a projection optical system or the like, which is used in a lithography step of manufacturing a semiconductor element and transfers a mask pattern onto a photosensitive substrate, and a projection exposure apparatus using the method.

BACKGROUND OF THE INVENTION

The manufacture of a semiconductor element or the like by photolithography uses a projection exposure apparatus for transferring a circuit pattern or the like on a reticle or photomask (to be generally referred to as a reticle hereinafter) to a semiconductor wafer (photosensitive substrate) or the like coated with a photosensitive agent. A projection exposure apparatus of this type must accurately transfer a reticle pattern to a wafer at a predetermined magnification (reduction ratio). To meet this demand, the projection exposure apparatus must exploit a projection optical system which exhibits good imaging performance with little aberration. In recent years, a pattern exceeding the general imaging performance of an optical system is often transferred along with further miniaturization of a semiconductor device. The transfer pattern, therefore, is more sensitive to the aberration of the optical system. On the other hand, the projection optical system must increase the exposure area and numerical aperture (NA), which makes satisfactory aberration correction more difficult.

In this situation, demands are arising for measuring aberration, particularly, wavefront aberration of a projection optical system while the projection optical system is mounted in a projection exposure apparatus, i.e., is actually used for exposure. This enables more precise adjustment of lenses (optical system) corresponding to the use state and device design almost free from the influence of aberration. To meet these demands, the image intensity distribution is measured by a knife edge or slit, as a conventional means of obtaining the imaging performance of a projection optical system while the projection optical system is mounted in the exposure apparatus. Also, the contrast of a pattern having a specific shape such as a bar chart is obtained. However, these methods do not attain wavefront aberration. In some cases, an interferometer is used as a method of obtaining wavefront aberration. The interferometer is generally used as an inspection device in the manufacture of a projection optical system, and is not practically mounted in a projection exposure apparatus in terms of the technique and cost.

To measure the aberration of a projection optical system in lithography of manufacturing a semiconductor element by a method of obtaining an image intensity distribution by using a knife edge or slit, the S/N ratio in intensity distribution measurement must be about $10^6$ or more, which is very difficult to attain. To measure wavefront aberration by a method of obtaining a contrast by using a bar chart, the contrasts of many bar charts must be attained from a rough pitch to a pitch exceeding the resolution limit, which is not practical in terms of formation of bar charts and the measurement labor.

In the wavefront aberration measurement method using an interferometer, an interferometer made up of a prism, mirror, lens, and the like, and an interferometer illumination system with good coherence must be arranged near a reticle stage or wafer stage. In general, the space near the wafer stage or reticle stage is limited, and the sizes of the interferometer and illumination system are also limited. Limitations are also imposed in terms of heat generation and vibrations, and the interferometer is difficult to mount. With recent decreases in exposure wavelength, an interferometer light source with good coherence in the exposure wavelength region does not exist or is very expensive. Thus, it is impractical in terms of the technique to mount an interferometer type aberration measurement device in a projection exposure apparatus.

SUMMARY OF THE INVENTION

It is an object of the present invention to provide a wavefront aberration measurement method capable of easily measuring the imaging performance, particularly, wavefront aberration of a projection optical system in a projection exposure apparatus, and a projection exposure apparatus using the method.

It is another object of the present invention to provide a wavefront aberration measurement method capable of easily measuring the wavefront aberration of a projection optical system in an actual projection state in an apparatus for projecting a reticle pattern onto a wafer, and a projection exposure apparatus using the method.

According to the present invention, the foregoing object is attained by providing a wavefront aberration measurement method of measuring wavefront aberration of a projection optical system in a projection exposure apparatus for projecting a reticle pattern onto a substrate via the projection optical system, comprising: the measurement step of measuring a light intensity of an image formed by a beam having passed through a phase shift pattern when the phase shift pattern set near an image plane or object plane of the projection optical system for forming an image of a pattern is scanned in one or a plurality of directions perpendicular to an optical axis of the projection optical system; and the signal processing step of calculating the wavefront aberration of the projection optical system on the basis of a measurement result of the measurement step.

Other features and advantages of the present invention will be apparent from the following description taken in conjunction with the accompanying drawings, in which like reference characters designate the same or similar parts throughout the figures thereof.

DETAILED DESCRIPTION OF THE PREFERRED EMBODIMENTS

Figure 1:
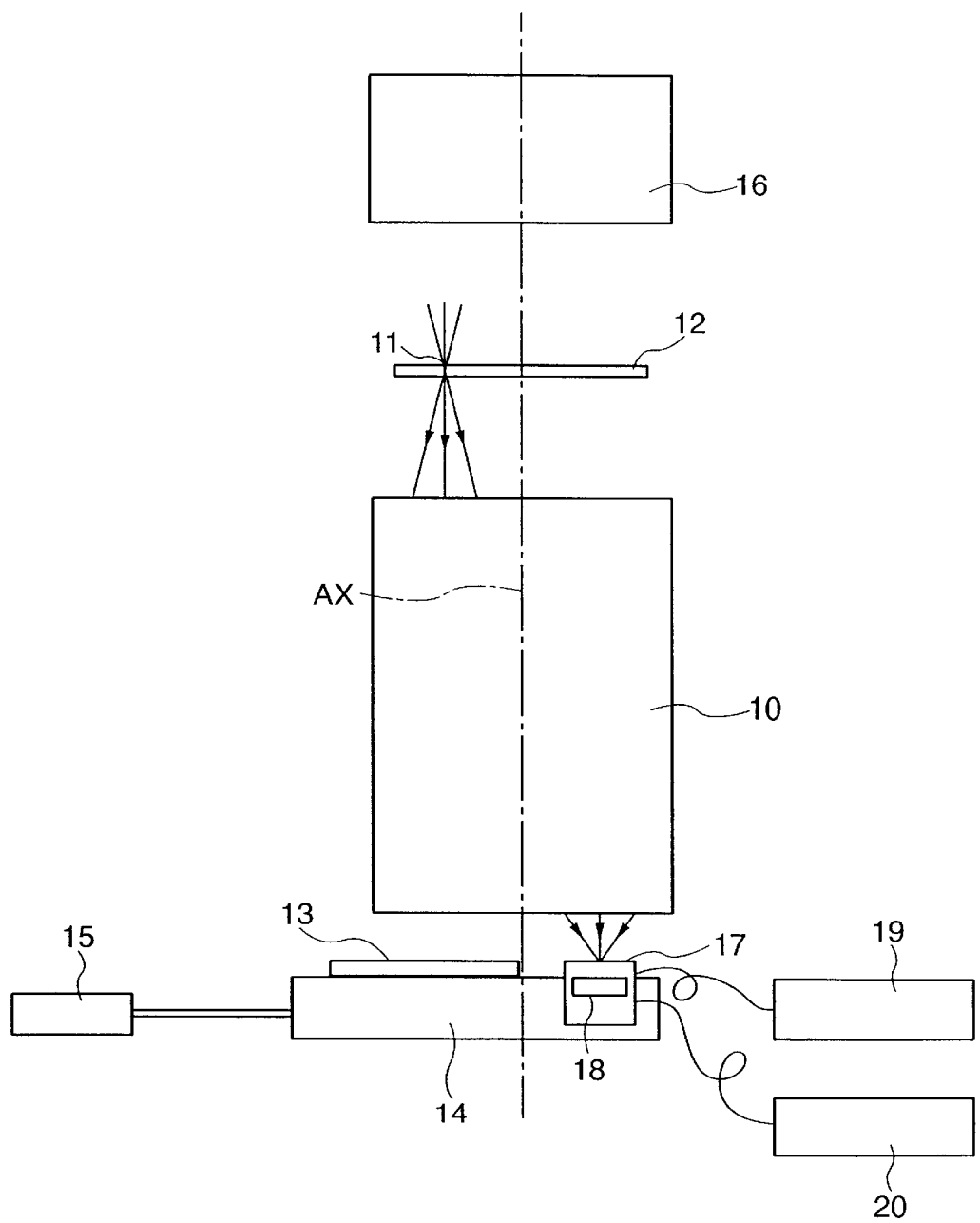
FIG. 1 is a schematic view showing the main part of an embodiment according to the present invention.

FIG. 1 is a schematic view showing the main part of a projection exposure apparatus using a wavefront aberration measurement method according to an embodiment of the present invention.

The projection exposure apparatus of this embodiment projects a reticle pattern onto a wafer by a step & repeat method or step & scan method, and develops the wafer to manufacture a device such as an IC, LSI, CCD, or liquid crystal panel. A measurement principle to measure the wavefront aberration of a projection optical system in the embodiment will be explained.

In FIG. 1, an exposure apparatus (projection exposure apparatus) for illuminating a first transfer pattern on a reticle or photomask (reticle) under the first illumination conditions of a first illumination system and projecting the first pattern to an exposure region on a photosensitive substrate (wafer) on the imaging plane of the first pattern that is formed via a projection optical system 10 has a third pattern 17 near the imaging position of a second pattern that is formed via the projection optical system 10 by illuminating the second pattern on the reticle or photomask or another reticle or photomask under the second illumination conditions of a second illumination system, and has a light intensity distribution measurement device (light intensity distribution measurement means) 18 for measuring the light intensity of a beam having passed through the third pattern 17. The third pattern 17 is scanned in one or a plurality of directions perpendicular to the optical axis of the projection optical system 10. The wavefront aberration of the projection optical system 10 is attained from a change in light intensity distribution obtained by the light intensity distribution measurement device 18 in synchronism with the scan.

The third pattern 17 is a phase shift pattern.

Figure 13:
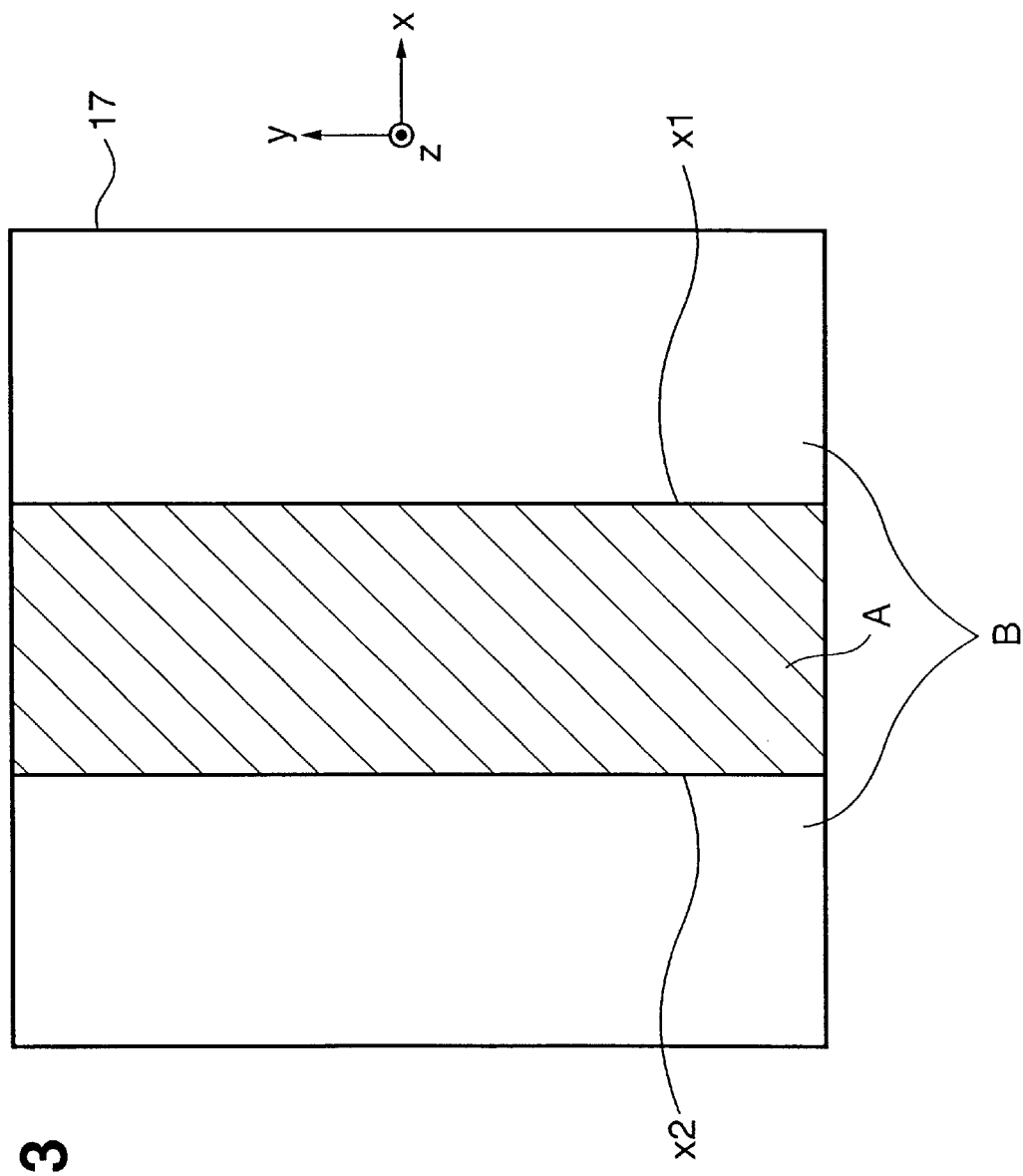
FIG. 13 is a view for explaining a phase shift pattern according to the present invention.

As shown in FIG. 13, the third pattern 17 is made up of at least two regions A and B. A beam having passed through the two regions A and B changes in phase by a relative phase difference π.

The wavefront aberration measurement means of the embodiment is based on the principle adopted in, e.g., the Foucah test, wire test, phase modulation test, and Ronchi test (see, e.g., Daniel Malacara, "Optical Shop Testing", John Wiley & Sons, Inc., page 231 (1978)).

Figure 2:
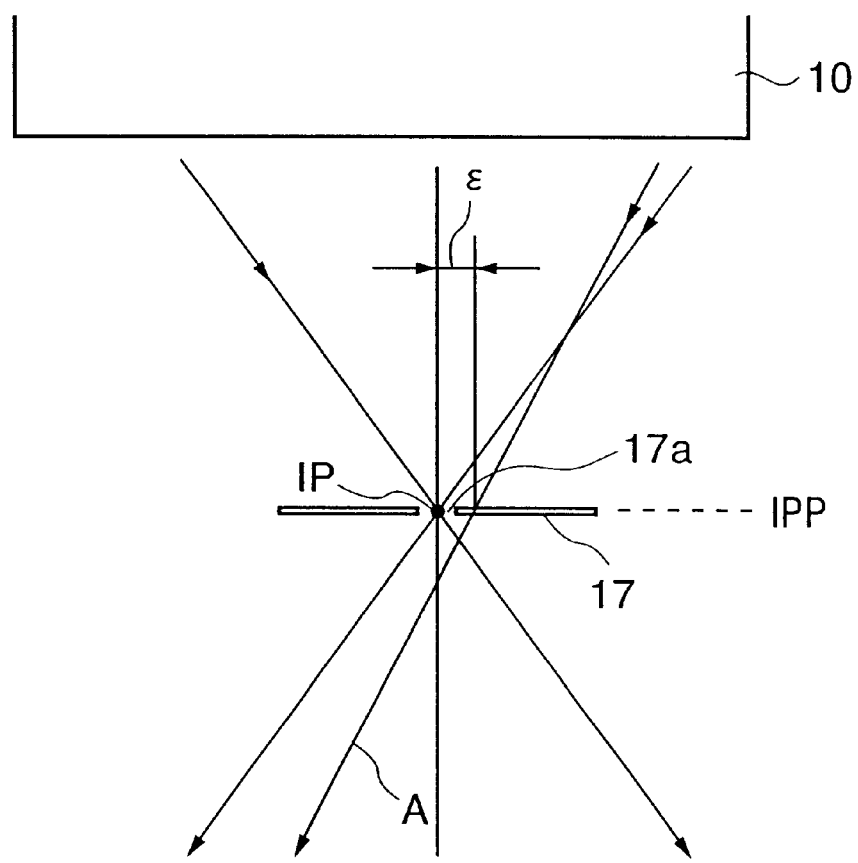
FIG. 2 is a view for explaining part of FIG. 1.

In general, a beam coming from a point object converges to one imaging point in an ideal projection optical system free from any aberration, but does not converge to one point in the presence of aberration. FIG. 2 shows the state of a beam near the imaging point on an imaging plane IPP. In FIG. 2, a ray A deviates from an ideal imaging point IP on the imaging plane IPP.

Figure 3:
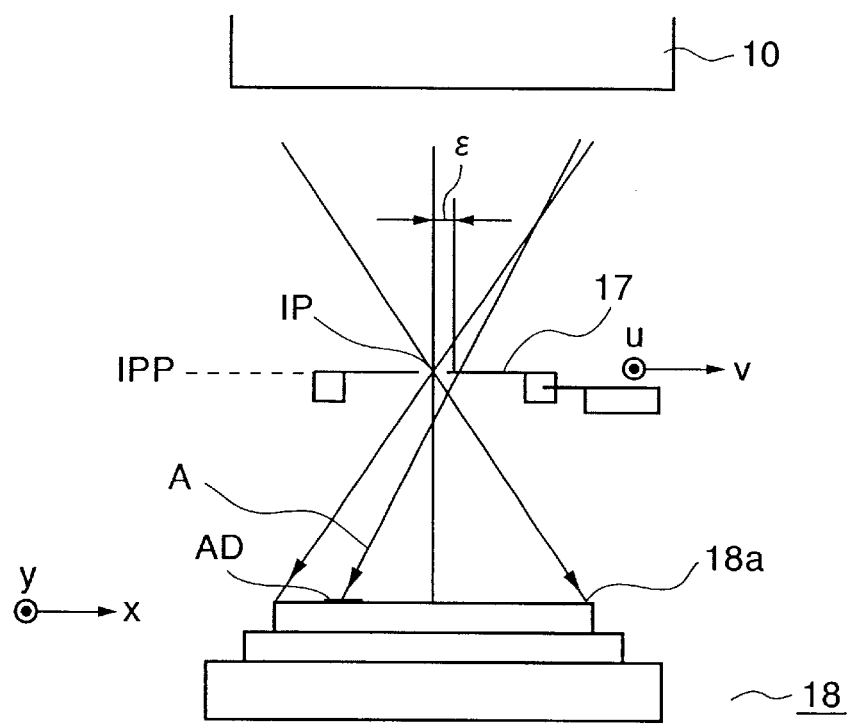
FIG. 3 is a view for explaining part of FIG. 1.

FIG. 3 is a view showing a state in which the third pattern 17, and the light intensity distribution measurement device 18 for measuring the light intensity distribution of a beam having passed through the light transmission portion of the third pattern 17 are arranged near the imaging point on the imaging plane IPP. Let coordinates (u, v) be the position of the third pattern 17 on the plane (imaging plane) IPP perpendicular to the optical axis of the projection optical system 10, and (x, y) be the coordinates of a light intensity measurement surface 18a of the light intensity distribution measurement device 18. A position on the light intensity measurement surface 18a of the light intensity distribution measurement device 18 is in one-to-one correspondence with a position on the exit pupil of the projection optical system 10. This can be realized by separating the light intensity distribution measurement device 18 from the imaging plane IPP of the projection optical system 10 by a certain distance.

In FIG. 3, the ray A deviates from the ideal imaging point IP owing to aberration and is shielded by the non-transmission portion of the third pattern 17. In this state, a portion AD corresponding to the ray A is dark in the light intensity distribution of a beam having passed through the light transmission portion of the third pattern 17 on the measurement surface 18a of the light intensity distribution measurement device 18.

Figure 11:
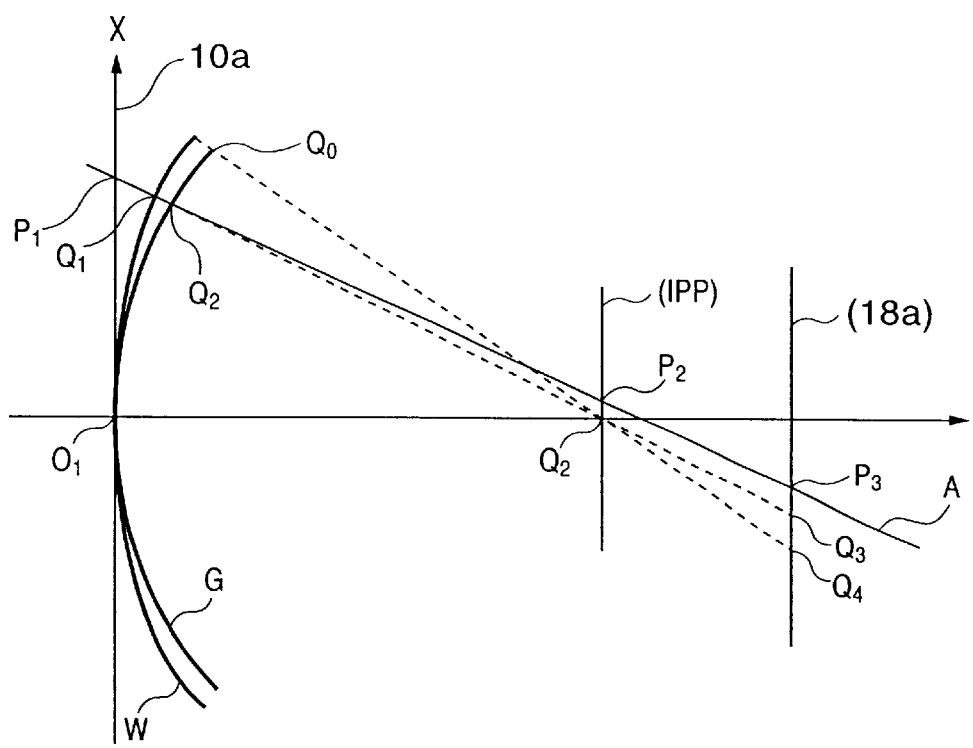
FIG. 11 is a view showing the relationship between the wavefront of the projection optical system and a ray.

FIG. 11 is a view showing the relationship between the exit pupil of the projection optical system 10, the imaging plane IPP, the wavefront on the light intensity measurement surface 18a, and the ray in FIG. 3. W represents the wavefront of an imaging beam from a pattern 11 that is formed by the projection optical system 10, and this wavefront passes through the center of an exit pupil 10a. G represents a reference spherical plane; $O_1$, the center of the exit pupil 10a of the projection optical system 10; and $O_2$, the center of the reference spherical plane G.

Further, $P_1$: point at which the imaging beam from the first pattern 11 crosses the exit pupil plane;

$P_2$: point at which the imaging beam from the first pattern 11 crosses the imaging plane IPP;

$P_3$: point at which the imaging beam from the first pattern 11 crosses the intensity distribution measurement surface 18a of the light intensity distribution measurement device 18;

$Q_0$: point at which the maximum NA beam component of the imaging beam from the first pattern 11 crosses the reference spherical plane G;

$Q_1$: point at which the imaging beam from the first pattern 11 crosses the wavefront W;

$Q_2$: point at which the imaging beam from the first pattern 11 crosses the reference sphere G;

$Q_3$: point at which a straight line $Q_2O_2$ crosses the intensity distribution measurement surface 18a, i.e., point at which the imaging beam from the first pattern 11 crosses the intensity distribution measurement surface 18a when no aberration exists;

$Q_4$: point at which a straight line $Q_2O_2$ crosses the intensity distribution measurement surface 18a, i.e., point at which the outermost imaging beam from the first pattern 11 crosses the intensity distribution measurement surface 18a when no aberration exists.

Figure 4:
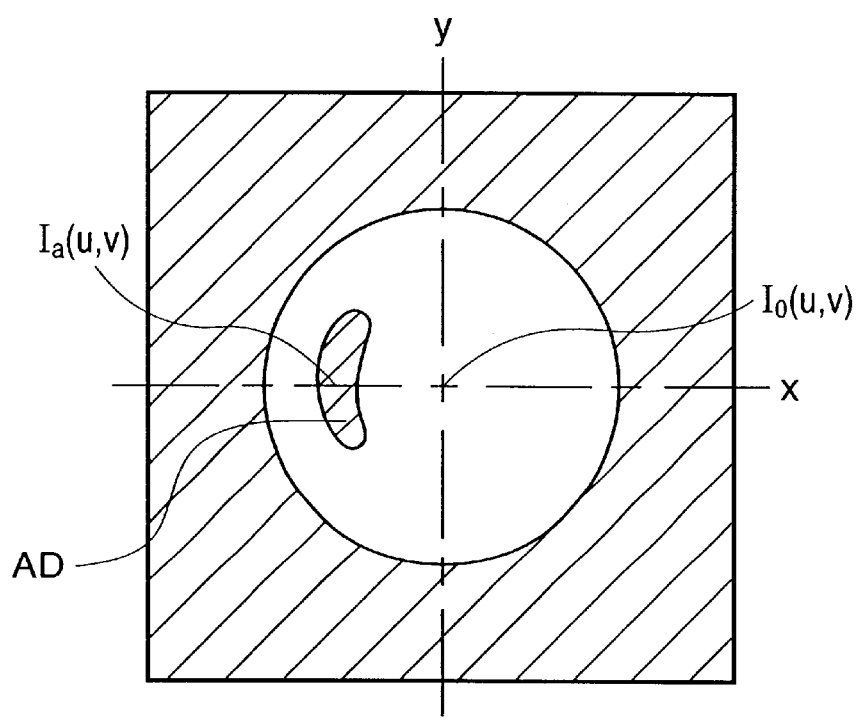
FIG. 4 is a view showing the light intensity distributions of rays A and P on the measurement surface of a light intensity distribution measurement device along the u and v axes.

FIG. 4 shows the shadow portion AD in FIG. 3 corresponding to a beam formed from the ray A and its neighboring rays. In FIG. 4, $I_0(u, v)$ represents the light intensity of a portion corresponding to a principal ray when the position of the third pattern 17 is (u, v), and $I_a(u, v)$ represents the light intensity of a portion corresponding to the ray A when the position of the third pattern 17 is (u, v).

As is apparent from FIG. 4, letting $(\epsilon, \eta)$ be the ray aberration of the ray A, the light intensity at a portion corresponding to the ray A becomes equal to $I_0(u, v)$:

$$I_a(u, v) = I_0(u-\epsilon, v-\eta)$$

when the third pattern 17 is moved by $(\epsilon, \eta)$.

Figure 6A:
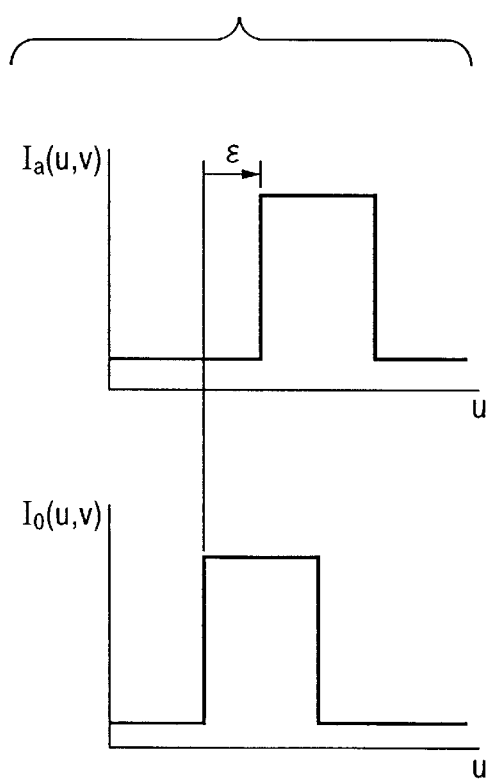
FIGS. 6A and 6B are graphs for explaining determination of ray aberration when a projection optical system suffers from aberration.
Figure 6B:
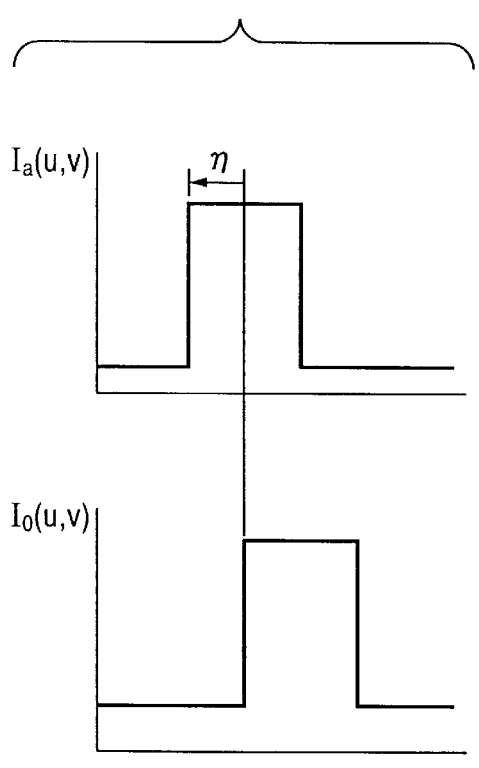

Changes in light intensity at respective points on the light intensity distribution measurement device 18 are plotted while the position (u, v) of the third pattern 17 is moved. Then, a pattern shifted in phase by an amount corresponding to ray aberration can be obtained, as shown in FIGS. 6A and 6B. This phase shift amount can be obtained to determine ray aberration.

In this embodiment, the third pattern is a phase shift pattern. For descriptive convenience, the use of the third pattern 17, which has a square aperture 17a formed in a non-transmission substrate shown in FIG. 5, will be described as reference.

FIG. 6A is a graph showing the plots of the light intensities $I_a(u, v)$ and $I_0(u, v)$ on the measurement surface of the light intensity distribution detection device 18 along the u axis. In FIG. 6A, the two plots have a phase shift of a ray aberration $\epsilon$ along the u axis.

FIG. 6B is a graph showing the plots of the light intensities $I_a(u, v)$ and $I_0(u, v)$ on the measurement surface of the light intensity distribution detection device 18 along the v axis. In FIG. 6B, the two plots have a phase shift of a ray aberration $\eta$ along the v axis.

Since each point (x, y) on the light intensity measurement surface of the light intensity distribution measurement device 18 is in one-to-one correspondence with the exit pupil of the projection optical system 10, the ray aberration $(\epsilon, \kappa)$ is regarded as aberration of a ray having passed through the point (x, y) on the exit pupil.

In the above description, the second pattern 11 is regarded as a point object. If the second pattern 11 is an object smaller than the isoplanatic region of the projection optical system 10, the pattern 11 need not be so small as to be regarded as a point object. Aberration is regarded to be equal throughout the isoplanatic region. Imaging beams with the same aberration that pass through respective points of the second pattern 11 are superimposed into the image of the second pattern. The plot obtained by scanning the third pattern 17 has a distribution obtained by superimposing by the size of the second pattern image the plots in which the second pattern 11 is regarded as a point object.

Figure 7:
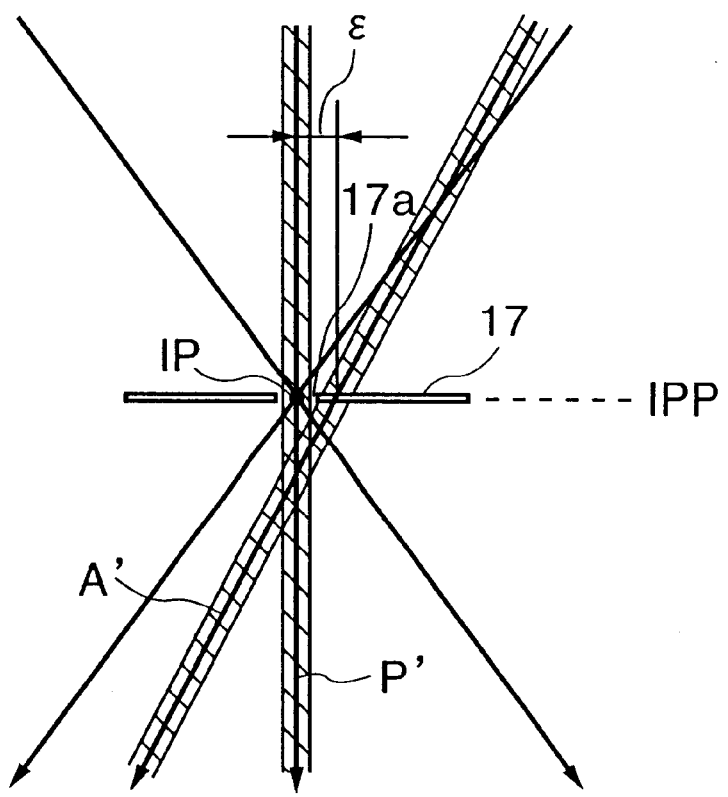
FIG. 7 is a view for explaining determination of ray aberration when the projection optical system suffers from aberration.

FIG. 7 shows a beam near the imaging point of the projection optical system when the second pattern is a square aperture in the isoplanatic region. A' represents a beam corresponding to the ray A; and P', a beam corresponding to the principal ray. The sections of the two beams are squares equal in size because of the isoplanatic region, and the beam A' deviates from the beam P' by the aberration $(\epsilon, \eta)$ of the ray A. Let $I'_0(u, v)$ be the light intensity of a portion corresponding to the beam P' when the position of the third pattern 17 is (u, v), and $I'_a(u, v)$ be the intensity of a portion corresponding to the beam A'. Then, as is apparent from FIGS. 6A and 6B, $$I'_a(u, v) = I'_0(u-\epsilon, v-\eta).$$

Changes in light intensity at respective points on the light intensity measurement surface 18a of the light intensity distribution measurement device 18 are plotted while the position (u, v) of the third pattern 17 is moved. Then, a distribution shifted in phase by an amount corresponding to ray aberration (changes along with movement) can be obtained. This phase shift amount can be obtained to determine ray aberration.

Figure 5:
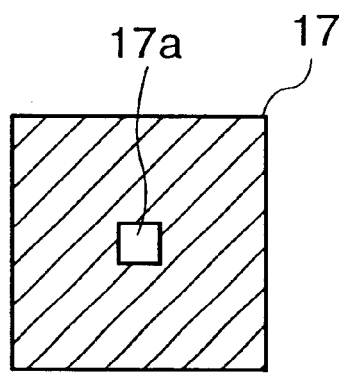
FIG. 5 is a view for explaining a pattern.

The third pattern 17 is a pattern used when the square aperture 17a is formed in the non-transmission substrate shown in FIG. 5.

Figure 9:
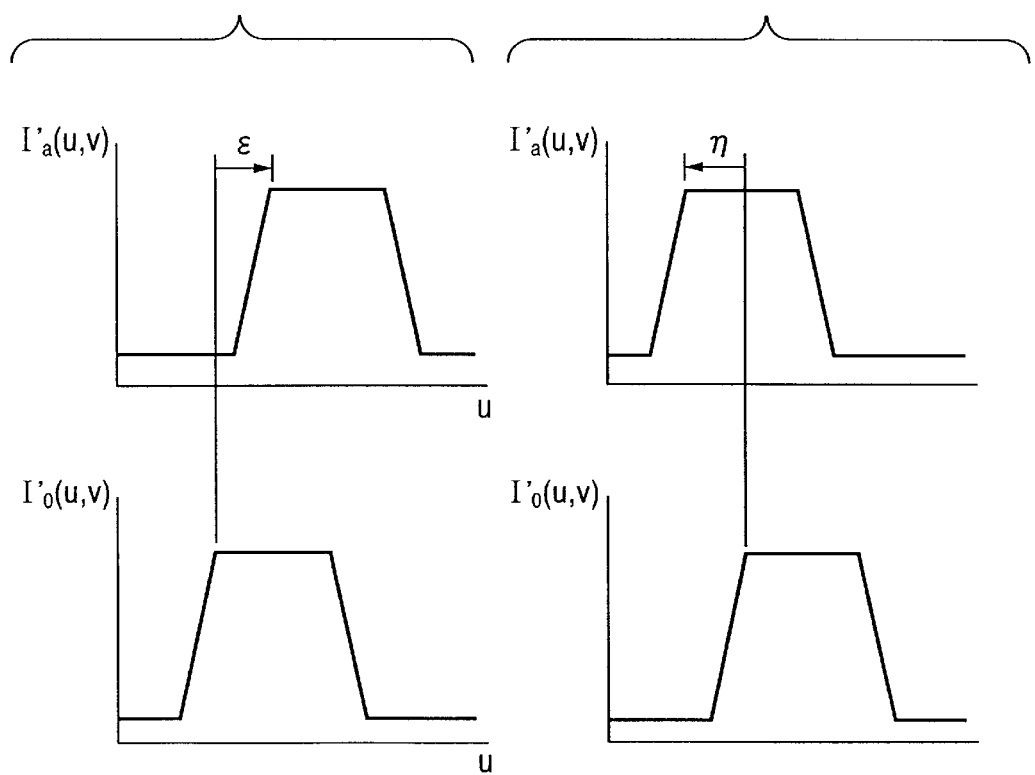
FIGS. 9A and 9B are views showing the light intensity distributions of rays A' and P' on the measurement surface of the light intensity distribution measurement device along the u and v axes.

FIG. 9A is a graph showing the plots of the light intensities $I'_a(u, v)$ and $I'_0(u, v)$ on the measurement surface of the light intensity distribution detection device 18 along the u axis. In FIG. 9A, the two plots have a phase shift of the ray aberration $\epsilon$ along the u axis.

FIG. 9B is a graph showing the plots of the light intensities $I'_a(u, v)$ and $I'_0(u, v)$ on the measurement surface of the light intensity distribution measurement device 18 along the v axis. In FIG. 9B, the two plots have a phase shift of the ray aberration $\eta$ along the v axis.

From this, as far as the second pattern falls within the isoplanatic region, the ray aberration $(\epsilon, \eta)$ can be attained similarly to a case wherein the second pattern is regarded as a point object.

Letting R be the optical path length between the position where the imaging beam crosses the reference spherical plane and the position where the imaging beam crosses the imaging plane, wavefront aberration $\phi$ and the ray aberration $(\epsilon, \eta)$ satisfy $$\varepsilon(x, y) = R' \frac{\partial \phi}{\partial x} \quad (1)$$

$$\eta(x, y) = R' \frac{\partial \phi}{\partial y} \quad (2)$$

The wavefront aberration $\phi$ can be obtained from this relationship. This relationship is described in, e.g., Max Born, Emill Wolf, "Principles of Optics $6^{th}$ Edition", Chapter V, 1993, Pergamon Press.

This embodiment can implement a projection exposure apparatus using a waveform aberration measurement method based on the above-described measurement principle with the same size as that of an imaging performance measurement device using a knife edge, slit, or bar chart, which is available for a projection exposure apparatus.

Examples of the projection exposure apparatus using the waveform aberration measurement method of the embodiment will be described below with reference to FIG. 1.

FIG. 1 shows the arrangement of a projection exposure apparatus having the second pattern 11, third pattern 17, and light intensity distribution measurement device 18 for measuring the imaging performance of the projection optical system 10 according to the embodiment. Reference numeral 16 denotes a second illumination system, which illuminates the second pattern 11. The second illumination system 16 also serves as a first illumination system for illuminating a mask (reticle) 12. A beam emitted by the second illumination system 16 passes through the mask 12 bearing the second pattern 11, and forms the image of the second pattern 11 via the projection optical system 10.

The imaging beam based on the second pattern 11 passes through the third pattern 17 arranged at or near the imaging position of the second pattern 11, and reaches the measurement surface 18a of the light intensity distribution measurement device 18 where the light intensity distribution is measured.

The third pattern 17 and light intensity distribution measurement device 18 are mounted on a wafer stage 14 and aligned to or near the imaging position of the second pattern 11. Reference numeral 15 denotes a driving device for the wafer stage 14; 13, a wafer chuck; 19, a controller device using an actuator for scanning the third pattern 17 within a plane parallel (perpendicular) to the optical axis; and 20, a signal processor for processing a light intensity signal (light intensity distribution) detected by the light intensity distribution measurement device 18.

A beam emitted by the second illumination system 16 sufficiently covers the entrance pupil of the projection optical system 10 after it passes through the second pattern 11. This is realized by using the second illumination system 16 as an illumination system with a σ=1.

The second pattern 11 is an object smaller than the isoplanatic region of the projection optical system 10. For the projection system of an exposure apparatus for manufacturing a semiconductor element, several % of the screen size is regarded as a standard isoplanatic region. For an exposure apparatus using a 6" mask, the second pattern 11 must be within several mm in size.

Figure 8:
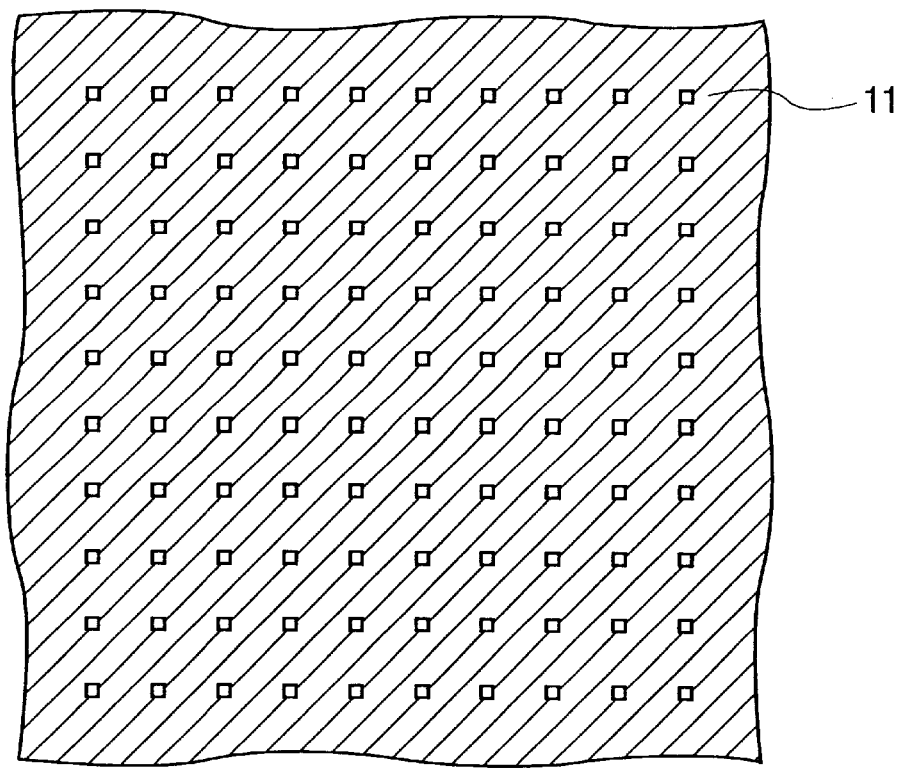
FIG. 8 is a view for explaining a pattern.

FIG. 8 shows an example in which rectangular apertures are arrayed as the second pattern 11 in a 10×10 matrix in the mask 12. The imaging performance can be measured at a plurality of image points within a plane perpendicular to the optical axis by arraying a plurality of second patterns 11 and measuring the imaging performance at the respective imaging positions.

Figure 10:
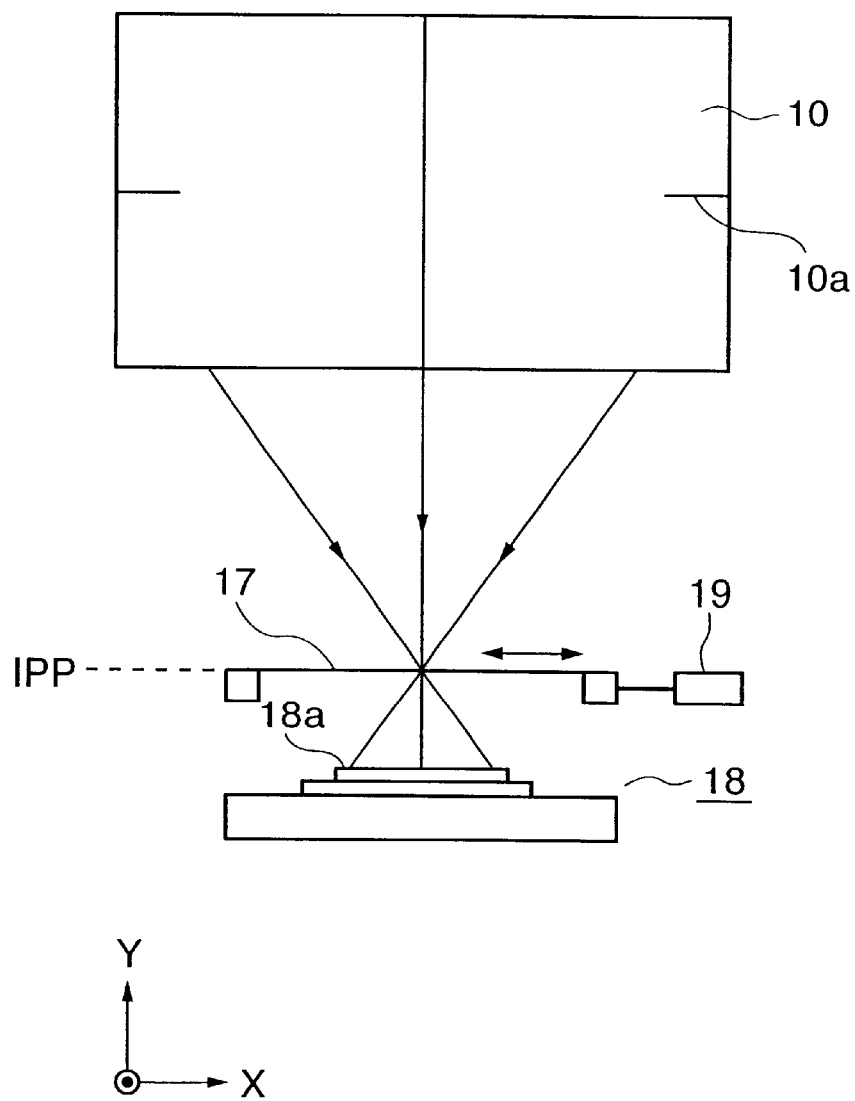
FIG. 10 is an enlarged view for explaining part of FIG. 1.

FIG. 10 is a partial enlarged view showing the third pattern 17 and light intensity distribution measurement device 18. The third pattern 17 and light intensity distribution measurement device 18 are aligned by the wafer stage 14 so as to locate the third pattern 17 near the imaging position of the second pattern 11.

A position on the light intensity measurement surface 18a of the light intensity distribution measurement device 18 has a margin enough to establish one-to-one correspondence with a position on the exit pupil 10a of the projection optical system 10. This can be realized by separating the light intensity distribution measurement device 18 from the imaging position of the projection optical system 10 by a certain distance. This can also be realized by using a pupil imaging optical system. The light intensity distribution measurement device 18 is constituted such that, e.g., a two-dimensional solid-state image sensor is used with each pixel serving as a light-receiving unit and a total of the sectional areas of beams captured by respective light-receiving units sufficiently cover the area of the exit pupil 10a on the exit pupil 10a of the projection optical system 10.

In this embodiment, the third pattern 17 in FIG. 1 uses a phase shift slit pattern suitable when the spatial coherence of a scan beam increases depending on the size and illumination conditions of the second pattern 11.

Figure 12:
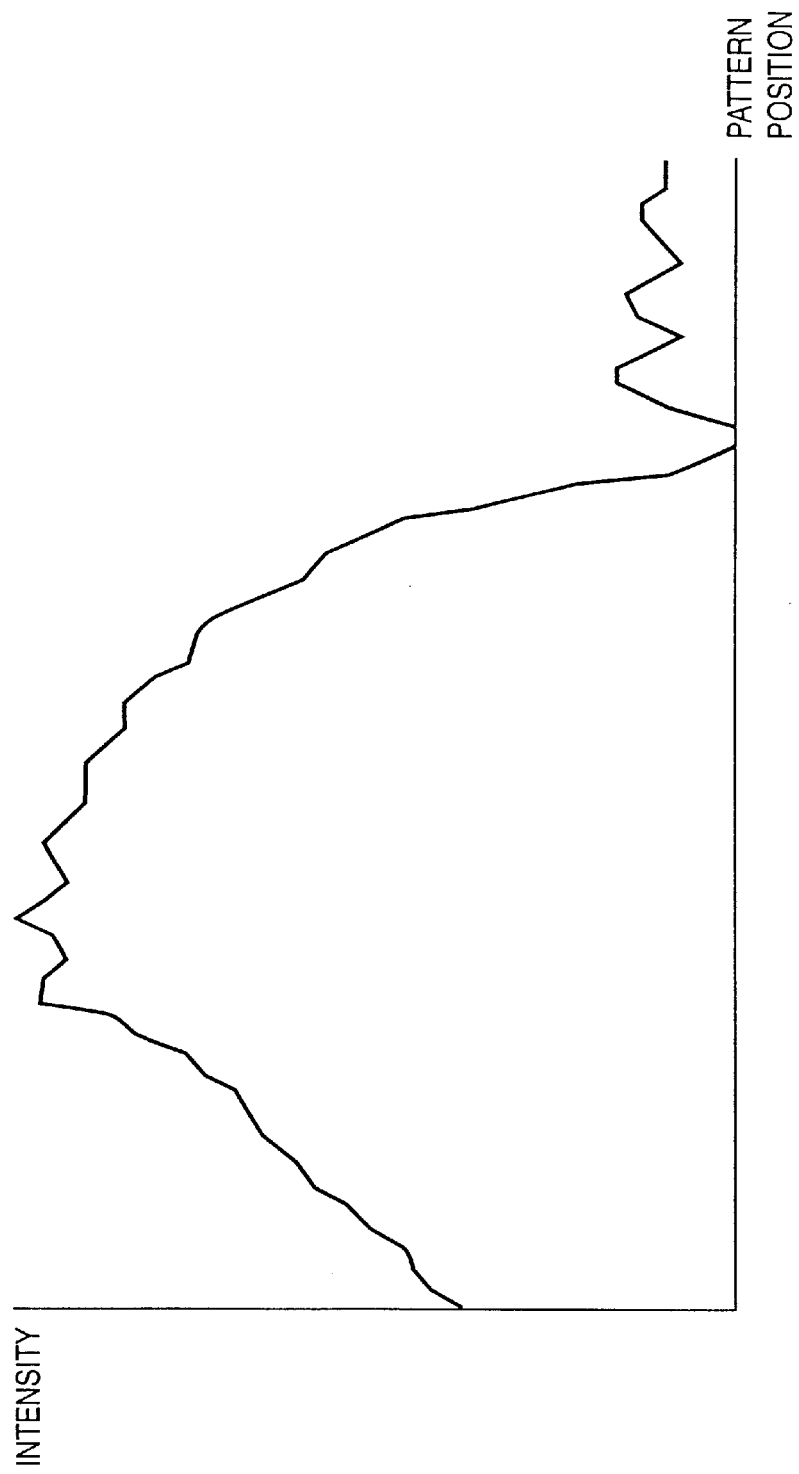
FIG. 12 is a graph for explaining the light intensity distribution on the pupil plane in the use of an amplitude pattern.
Figure 14:
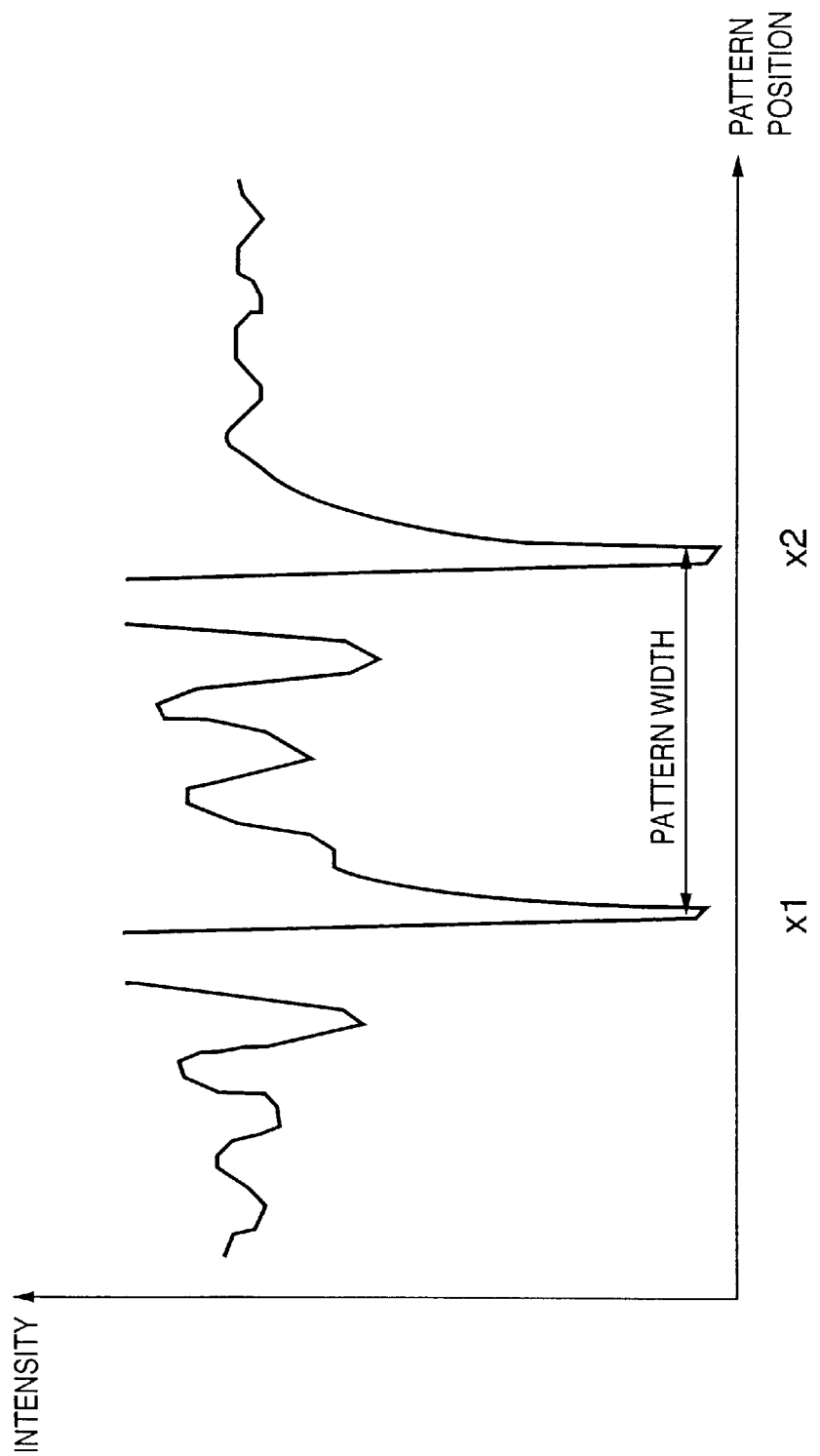
FIG. 14 is a graph for explaining the light intensity distribution on the pupil plane in the use of the phase shift pattern according to the present invention.

Examples of the light intensity distribution for a large spatial coherence are shown in FIGS. 12 and 14.

FIG. 12 shows the simulation results of the light intensity distribution when the second pattern 11 is an infinitesimal point source and the third pattern 17 is an amplitude pattern (aperture slit) having transmittances of 0 and 100, as shown in FIG. 5.

Since the second pattern 11 is a point source, a beam coming from the point source has spatial coherence. When the amplitude pattern is used as the third pattern 17, a beam having passed through the aperture slit 17a of the third pattern 17 diverges by diffraction. The light intensity smoothly changes with respect to scan of the pattern, as shown in FIG. 12, which makes it difficult to determine the position of the aperture slit 17a.

FIG. 14 shows the simulation results of the light intensity distribution when a phase shift pattern 17 as shown in FIG. 13 is used as the third pattern 17 under the same illumination conditions as those in FIG. 12.

As shown in FIG. 13, the phase shift pattern 17 is formed from two regions A and B. Light having passed through the phase shift pattern 17 attains a relative phase difference π by the regions A and B. This phase shift pattern 17 can be implemented by changing the thickness between the two regions A and B or changing the refractive index between the materials of the two regions A and B.

The light intensity changes depending on the position on the phase shift pattern 17 such that the intensity abruptly decreases when a beam passes through boundary regions x1 and x2 on the phase shift pattern 17. The interval between the peaks corresponds to a width |x1−x2| of the region A of the phase shift pattern 17 in the x direction.

FIG. 10 is an enlarged view showing the vicinity of the phase shift pattern 17 when the phase shift pattern 17 is applied as the third pattern.

The phase shift pattern 17 shown in FIG. 13 is applied as the third pattern, and the phase shift pattern 17 is scanned by the controller 19 shown in FIG. 10 from a −x direction to a +x direction so as to pass through an ideal imaging point P0. Considering beams which have passed through one region of the pupil and reach the phase shift pattern 17, they receive the same phase modulation in passing through regions other than the boundary regions x1 and x2 of the phase shift pattern 17 shown in FIG. 13. Thus, the intensity is directly observed by the light intensity distribution measurement device 18.

In the light intensity distribution measurement device 18, as shown in FIG. 3, the light intensity measurement surface 18a such as a two-dimensional sensor is arranged in a so-called far-field region with respect to the focusing point IP. The light intensity measurement surface 18a can be made in one-to-one correspondence with the exit pupil of the examination optical system 10. The light intensity distribution measurement device 18 may adopt a pupil conjugate optical system which makes the light intensity measurement surface be conjugate to the pupil of the examination optical system 10.

When beams pass through the boundary regions x1 and x2 of the phase shift pattern 17, they change in phase with relative phase differences π, which are different between the regions A and B. The beams phased-modulated by the relative phase differences π interfere with each other so as to cancel each other, decreasing the intensity.

In this way, even if a beam having passed through the second pattern 11 has spatial coherence, the phase shift pattern 17 used as the third pattern abruptly changes the light intensity distribution, enabling high-precision aberration measurement.

In this state, the phase shift pattern 17 is scanned by the actuator 19 in a plane perpendicular to the optical axis. On the basis of the principle shown in FIGS. 3, 4, 5, 6A, and 6B, the signal processor 20 processes changes in light intensity (light intensity distribution) at the respective light-receiving units of the light intensity distribution measurement device 18 with respect to the position of the phase shift pattern 17. As a result, ray aberration (ε(x, y), η(x, y)) can be obtained. Note that (x, y) represents positional coordinates on the measurement surface of the light intensity distribution measurement device 18, and also represents coordinates on the exit pupil of the projection optical system. The signal processor 20 calculates wavefront aberration φ(x, y) from the obtained ray aberration on the basis of equations described above:

$$\varepsilon(x, y) = R' \frac{\partial \phi}{\partial x} \quad (3)$$

$$\eta(x, y) = R' \frac{\partial \phi}{\partial y} \quad (4)$$

In FIG. 1, the second pattern is disposed on the reticle surface side of the projection exposure apparatus, and the phase shift pattern as the third pattern is disposed on the wafer surface side. However, the present invention is not limited to this arrangement, and may employ an arrangement in which the second pattern is disposed on the wafer side and the third pattern is disposed on the reticle side. In this case, the illumination optical system is disposed on the wafer side to illuminate the second pattern. Then, the image of the second pattern is formed on the reticle side via the projection optical system 10. The phase shift pattern as the third pattern is set near the position of the second pattern image and scanned perpendicularly to the optical axis. By the same principle as that described above, the aberration of the projection optical system 10 can be measured.

In the projection exposure apparatuses of the above-described embodiment, a plurality of lenses among a plurality of optical elements, which constitute the projection optical system 10, are movable along and/or perpendicularly to the optical axis, and supported rotatably about axes along and perpendicularly to the optical axis. Aberrations (particularly, Seidel's five aberrations) of one or a plurality of values in the optical system 10 can be corrected or optimized by moving one or a plurality of lenses by an aberration adjustment driving system or adjustment mechanism (not shown) on the basis of wavefront aberration information obtained by the above-mentioned method. A means for correcting the aberration of the projection optical system 10 includes not only a movable lens, but also various known systems such as a movable mirror (when the optical system is a catadioptric system), a titlable plane-parallel plate, and a pressure-controllable space.

An embodiment of a semiconductor device manufacturing method using the projection exposure apparatus of the present invention will be explained.

Figure 15:
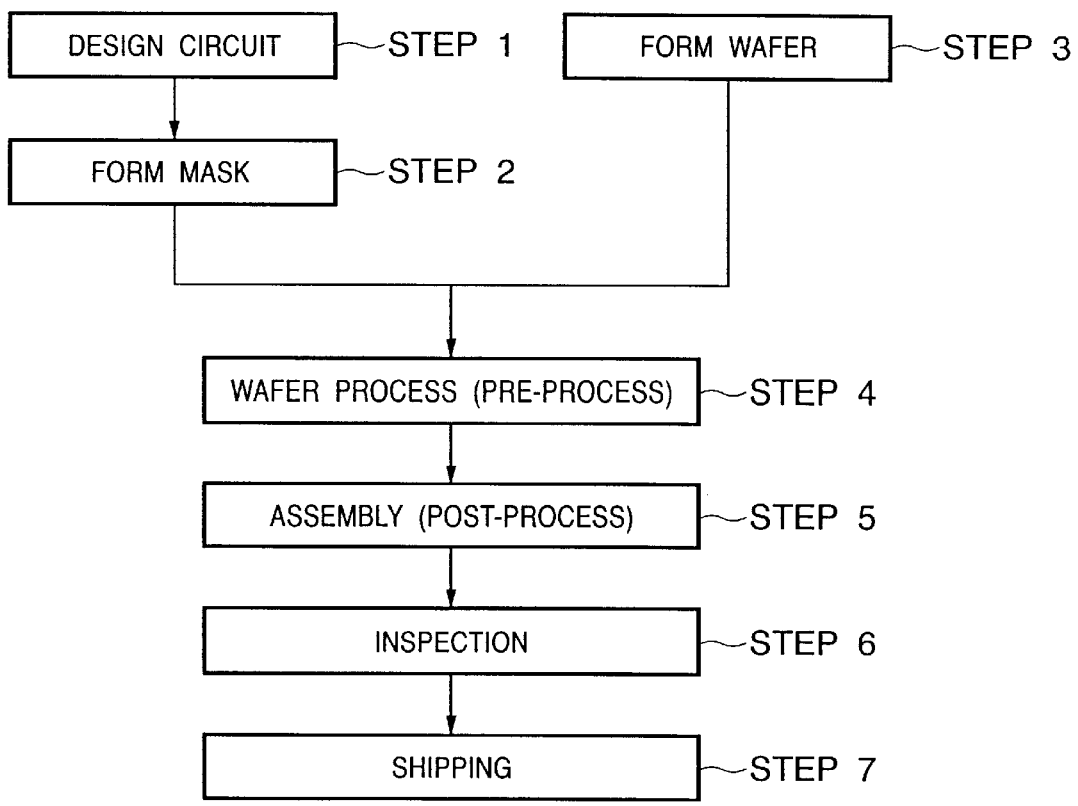
FIG. 15 is a flow chart showing a device manufacturing method according to the present invention.

FIG. 15 shows the manufacturing flow of manufacturing a semiconductor device (e.g., a semiconductor chip such as an IC or LSI, a liquid crystal panel, or a CCD).

In step 1 (circuit design), a semiconductor device circuit is designed. In step 2 (mask formation), a mask having the designed circuit pattern is formed.

In step 3 (wafer formation), a wafer is formed by using a material such as silicon. In step 4 (wafer process), called a pre-process, an actual circuit is formed on the wafer by lithography using the prepared mask and wafer.

Step 5 (assembly), called a post-process, is the step of forming a semiconductor chip by using the wafer formed in step 4, and includes an assembly process (dicing and bonding) and a packaging process (chip encapsulation).

In step 6 (inspection), inspections such as the operation confirmation test and durability test of the semiconductor device manufactured in step 5 are conducted. After these steps, the semiconductor device is completed and shipped (step 7).

Figure 16:
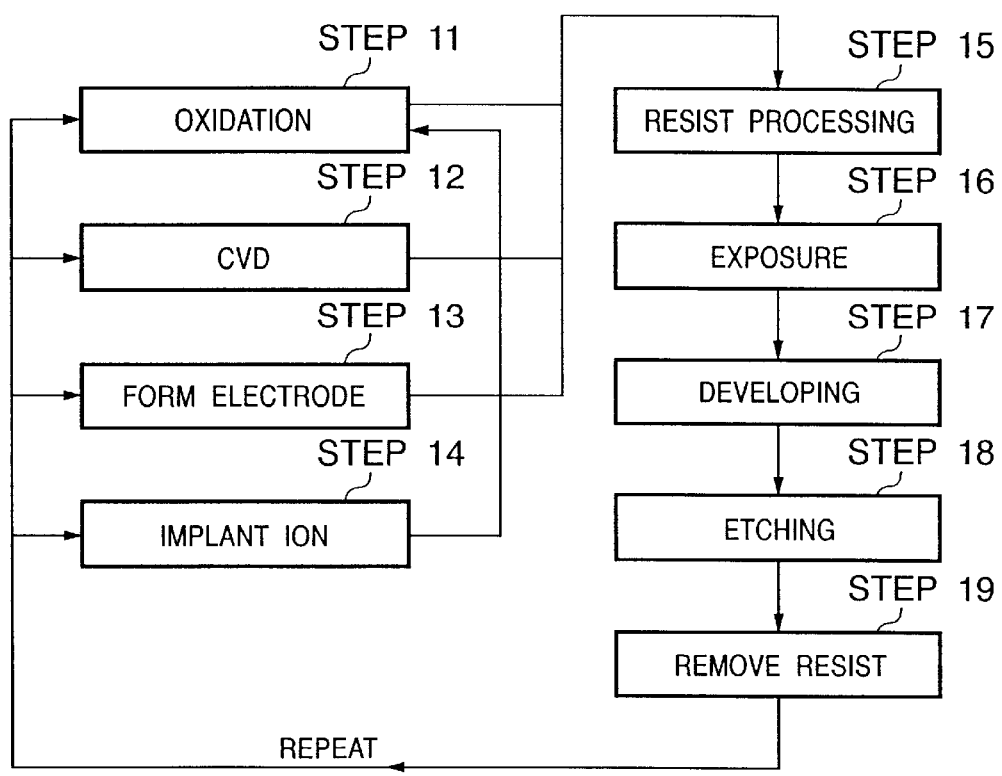
FIG. 16 is a flow chart showing the device manufacturing method according to the present invention.

FIG. 16 shows the detailed flow of the wafer process. In step 11 (oxidation), the wafer surface is oxidized. In step 12 (CVD), an insulating film is formed on the wafer surface.

In step 13 (electrode formation), an electrode is formed on the wafer by vapor deposition. In step 14 (ion implantation), ions are implanted in the wafer. In step 15 (resist processing), a photosensitive agent is applied to the wafer. In step 16 (exposure), the above-mentioned exposure apparatus exposes the wafer to the circuit pattern of a mask.

In step 17 (developing), the exposed wafer is developed. In step 18 (etching), the resist is etched except for the developed resist image. In step 19 (resist removal), an unnecessary resist after etching is removed. These steps are repeated to form multiple circuit patterns on the wafer.

The manufacturing method of this embodiment allows easily manufacturing a highly integrated semiconductor devices, which is difficult to manufacture by a conventional method.

The above-described embodiments can achieve a wavefront aberration measurement method capable of easily measuring the wavefront aberration of a projection optical system, and a projection exposure apparatus using the method.

In addition, the above-described embodiments can achieve a wavefront aberration measurement method capable of easily measuring the wavefront aberration of a projection optical system in an actual projection exposure apparatus using the method.

As many apparently widely different embodiments of the present invention can be made without departing from the spirit and scope thereof, it is to be understood that the invention is not limited to the specific embodiments thereof except as defined in the appended claims.

What is claimed is:

1. A measurement method of measuring wavefront aberration of a projection optical system in a projection exposure apparatus for projecting a reticle pattern onto a substrate via the projection optical system, the method comprising:

a measurement step of measuring intensity of a light beam having passed through the projection optical system and a phase shift pattern at a plane conjugate to a pupil plane of the projection optical system or a plane spaced apart from the phase shift pattern enough to separately detect respective rays emerging from plural points of the pupil plane, when the phase shift pattern set near an image plane or object plane of the projection optical system for forming an image of a pattern is scanned in one or a plurality of directions perpendicular to an optical axis of the projection optical system; and a signal processing step of calculating the wavefront aberration of the projection optical system on the basis of a measurement result of the measurement step.

2. The method according to claim 1, wherein the phase shift pattern includes at least two regions, and beams having passed through the two regions change in phase by a relative phase difference of π.

3. A projection exposure apparatus for projecting a reticle pattern onto a substrate via a projection optical system, the apparatus comprising:

a predetermined pattern set near an image plane or object point of the projection optical system;

a phase shift pattern set near an imaging position of said predetermined pattern in forming an image of said predetermined pattern via the projection optical system;

a measurement device arranged to measure intensity of a light beam which forms the image of said predetermined pattern via the projection optical system and has passed through said phase shift pattern, at a plane conjugate to a pupil plane of the projection optical system or a plane spaced apart from the phase shift pattern enough to separately detect respective rays emerging from plural points of the pupil plane;

a scan mechanism arranged to scan said phase shift pattern; and a signal processor arranged to calculate wavefront aberration of the projection optical system from the light intensity obtained by said measurement device while scanning said phase shift pattern in one or a plurality of directions perpendicular to an optical axis of the projection optical system.

4. The apparatus according to claim 3, wherein said phase shift pattern includes at least two regions, and beams having passed through the two regions change in phase by a relative phase difference of $\pi$.

5. The apparatus according to claim 3, further comprising correction means for correcting aberration of the projection optical system on the basis of the wavefront aberration.

6. A device manufacturing method of manufacturing a device by using a projection exposure apparatus, the method comprising:

a transfer step of transferring a pattern of a reticle surface onto a substrate surface by using the projection exposure apparatus; and a developing step of developing the pattern on the substrate surface, the projection exposure apparatus having:

(i) a predetermined pattern set near an image plane or object point of the projection optical system, (ii) a phase shift pattern set near an imaging position of the predetermined patternin forming an image of the predetermined pattern via the projection optical system, (iii) a measurement device arranged to measure intensity of a light beam which forms the image of said predetermined pattern via the projection optical system and has passed through said phase shift pattern, at a plane conjugate to a pupil plane of the projection optical system or a plane spaced apart from the phase shift pattern enough to separately detect respective rays emerging from plural points of the pupil plane;

(iv) a scan mechanism arranged to scan said phase shift pattern; and (v) a signal processor arranged to calculate wavefront aberration of the projection optical system from the light intensity obtained by said measurement device while scanning said phase shift pattern in one or a plurality of directions perpendicular to an optical axis of the projection optical system.

7. A device manufacturing method of manufacturing a device by using a projection exposure apparatus, the method comprising:

a measurement step of measuring intensity of a light beam having passed through the projection optical system and a phase shift pattern at a plane conjugate to a pupil plane of the projection optical system or a plane spaced apart from the phase shift pattern enough to separately detect respective rays emerging from plural points of the pupil plane, when the phase shift pattern set near an image plane or object plane of a projection optical system of the projection exposure apparatus for forming an image of a pattern is scanned in one or a plurality of directions perpendicular to an optical axis of the projection optical system;

a signal processing step of calculating the wavefront aberration of the projection optical system on the basis of a measurement result of the measurement step;

a transfer step of transferring a pattern on a reticle surface onto a substrate surface on the basis of the wavefront aberration calculated in the signal processing step by using the projection exposure apparatus for controlling the projection optical system; and a developing step of developing the pattern on the substrate surface.

* * * * *

UNITED STATES PATENT AND TRADEMARK OFFICE
CERTIFICATE OF CORRECTION

PATENT NO. : 6,650,398 B2 Page 1 of 1
DATED : November 18, 2003
INVENTOR(S) : Akihiro Nakauchi et al.

It is certified that error appears in the above-identified patent and that said Letters Patent is hereby corrected as shown below:

Title page,
Item [73], Assignee, "Canon Kabushi Kaisha" should read -- Canon Kabushiki Kaisha --.
Item [56], References Cited, OTHER PUBLICATIONS, "*Optical Shop Testing,*" reference, "J. Cornejo-Rodriguez," should read -- A. Cornejo-Rodriguez, --.
"Flanders, D.C." reference, "interferometic" should read -- interferometric --.

Column 3,
Line 65, "Foucah" should read -- Foucault --.

Column 4,
Line 4, "exists;" should read -- exists; and --.

Column 5,
Line 5, "$(\epsilon, \kappa)$" should read -- $(\epsilon, \eta)$ --.

Column 10,
Line 16, "devices," should read -- device, --.

Column 11,
Line 34, "patternin" should read -- pattern --.

Column 12,
Line 6, "pattern;" should read -- pattern, --.

Signed and Sealed this

Twenty-ninth Day of June, 2004

JON W. DUDAS
*Acting Director of the United States Patent and Trademark Office*